United States Patent
Tsui et al.

(10) Patent No.: US 6,828,823 B1
(45) Date of Patent: Dec. 7, 2004

(54) NON-VOLATILE AND RECONFIGURABLE PROGRAMMABLE LOGIC DEVICES

(75) Inventors: Cyrus Tsui, Los Altos Hills, CA (US); Benny Ma, Saratoga, CA (US); Om P. Agrawal, Los Altos, CA (US); Ju Shen, Saratoga, CA (US); Sam Tsai, Milpitas, CA (US); Jack Wong, Fremont, CA (US); Chan-Chi Jason Cheng, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 63 days.

(21) Appl. No.: 10/439,602

(22) Filed: May 16, 2003

(51) Int. Cl.[7] ............................................ H03K 19/177
(52) U.S. Cl. ........................................... 326/40; 326/46
(58) Field of Search ................................ 326/37–40, 46

(56) References Cited

U.S. PATENT DOCUMENTS

| | | | |
|---|---|---|---|
| 5,548,228 A | | 8/1996 | Madurawe |
| 5,640,107 A | * | 6/1997 | Kruse ........................... 326/38 |
| 5,696,455 A | | 12/1997 | Madurawe |
| 6,049,222 A | * | 4/2000 | Lawman ....................... 326/38 |
| 6,538,468 B1 | * | 3/2003 | Moore .......................... 326/40 |

* cited by examiner

Primary Examiner—James H. Cho
(74) Attorney, Agent, or Firm—MacPherson Kwok Chen & Heid LLP; Greg J. Michelson

(57) ABSTRACT

An integrated circuit includes non-volatile and volatile memory, with the volatile memory controlling the integrated circuit's functionality. Various techniques are disclosed for programming the different types of memory through one or more data ports to provide in-system programmability and dynamic reconfigurability. External configuration devices are not required if the data from the non-volatile memory is transferred directly to the volatile memory.

26 Claims, 2 Drawing Sheets

NON-VOLATILE AND RECONFIGURABLE PROGRAMMABLE LOGIC DEVICES

TECHNICAL FIELD

The present invention relates generally to electrical circuits and, more particularly, to systems and methods for providing, programming, and configuring non-volatile and reconfigurable programmable logic devices.

BACKGROUND

There are many different types of programmable logic devices (PLDs), such as for example complex programmable logic devices (CPLDS) and field programmable gate arrays (FPGAs). CPLDs typically provide numerous benefits, such as fast, predictable timing and single-level wide-logic support. CPLDs generally utilize electrically erasable complementary metal oxide semiconductor (EECMOS) technology, which is non-volatile but can be programmed only a limited number of times and takes longer to program than some other types of memory (e.g., static random access memory (SRAM)).

FPGAs typically provide benefits, such as high logic density and low standby power and generally utilize SRAM technology. SRAM is infinitely reconfigurable, but loses its programming upon power loss and generally requires an external non-volatile source to supply it with configuration data upon power-up. Various types of non-volatile technology have been introduced for FPGAs to replace SRAM. For example, antifuse-based technology provides non-volatility, but can not be reprogrammed and so is not reconfigurable. As another example, flash-based technology also provides non-volatility, but is not infinitely reconfigurable. Other types of non-volatile technology have been introduced, but typically suffer from various drawbacks, such as limited programmability. As a result, there is a need for improved programmable logic devices and techniques for programming the programmable logic devices.

SUMMARY

Systems and methods are disclosed herein to provide non-volatile and reconfigurable programmable logic devices. For example, in accordance with one embodiment of the present invention, EECMOS memory and SRAM are incorporated into a PLD to provide in-system programmability, dynamic reconfigurability, and essentially instant-on capability. The EECMOS memory technology eliminates the need for external configuration devices that are typically required for SRAM-based PLDs. The SRAM technology provides infinite reconfigurability, which is generally not available with EECMOS-based PLDs. Furthermore, flexible programming or configuration techniques are provided to supply configuration data to the EECMOS memory, the SRAM, or from the EECMOS memory to the SRAM.

More specifically, in accordance with one embodiment of the present invention, an integrated circuit includes volatile memory adapted to configure the integrated circuit for its intended function based on configuration data stored by the volatile memory; non-volatile memory adapted to store data which is transferable to the volatile memory to configure the integrated circuit; and a first data port adapted to receive external data for transfer into either the volatile memory or the non-volatile memory.

In accordance with another embodiment of the present invention, a programmable logic device includes volatile memory adapted to store configuration data to configure the programmable logic device; non-volatile memory adapted to store data and transfer the data to the volatile memory to configure the programmable logic device; and means for receiving external data and transferring the external data to the volatile memory or the non-volatile memory.

In accordance with another embodiment of the present invention, a method of providing programming and configuration options for a programmable logic device includes providing at least one data port adapted to receive configuration data; providing non-volatile memory, within the programmable logic device, adapted to receive the configuration data via at least one of the data ports; and providing volatile memory adapted to receive the configuration data via at least one of the data ports or via the non-volatile memory, the volatile memory further adapted to configure the programmable logic device for its intended function.

In accordance with another embodiment of the present invention, a programmable logic device includes volatile memory adapted to configure the programmable logic device for its intended function based on configuration data stored by the volatile memory; non-volatile memory adapted to store data which is transferable to the volatile memory to configure the programmable logic device, the non-volatile memory disposed within one or more areas of the programmable logic device that are separate from the volatile memory; and control logic adapted to transfer the data from the non-volatile memory to the volatile memory to configure the programmable logic device.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 1:
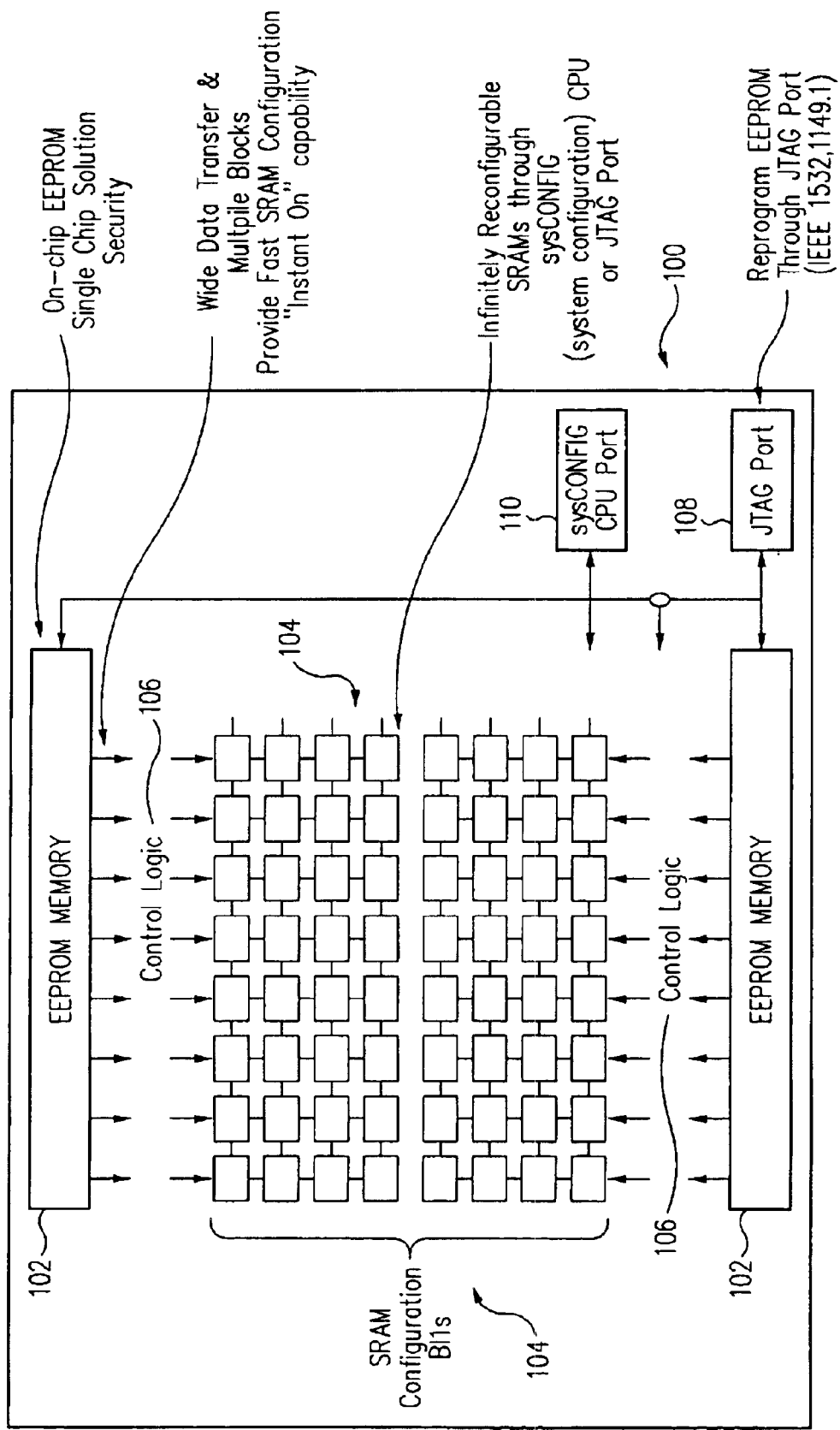
FIG. 1 shows a block diagram illustrating a programmable logic device in accordance with an embodiment of the present invention.

FIG. 1 shows a block diagram illustrating a programmable logic device (PLD) 100 in accordance with an embodiment of the present invention. PLD 100 includes electrically erasable programmable read only memory (EEPROM) 102 and SRAM 104. EEPROM 102 is non-volatile memory used to store configuration data, which can be transferred internally to SRAM 104, when desired via control logic 106, to configure PLD 100. SRAM 104 is the SRAM memory cells used to store configuration data that configures PLD 100 for its intended functionality.

It should be understood that EEPROM 102 represents an exemplary type of non-volatile memory, but other types of non-volatile memory (i.e., EECMOS based or not) that can be reprogrammed once or repeatedly may be substituted for EEPROM 102. Furthermore, either EECMOS 102 or SRAM 104 may be programmed (i.e., loading and storing information into the memory) to store configuration data for PLD 100, but the device functionality of PLD 100 is determined by the information stored in SRAM 104. Thus, PLD 100 is configured or reconfigured when information is programmed into SRAM 104.

EEPROM 102 and SRAM 104 within PLD 100 may be programmed by various techniques in accordance with an embodiment of the present invention. For example, EEPROM 102 may be programmed or reprogrammed via a joint test action group (JTAG) port 108 by employing, for example, standards such as either Institute of Electrical and Electronics Engineers (IEEE) 1149.1 or 1532 standards. As another example, SRAM 104 may be programmed or reprogrammed via JTAG port 108 or a central processing unit (CPU) port 110 (i.e., a peripheral data port). One or more control pins and/or instructions (e.g., control bits) may be employed, for example, to determine which memory (EEPROM 102 or SRAM 104) is to be programmed.

SRAM 104 may also be programmed via EEPROM 102 under the direction of conventional control logic 106. By combining EEPROM 102 and SRAM 104, a single integrated circuit (i.e., chip) solution is provided that offers numerous benefits. For example, SRAM 104 may be configured by EEPROM 102 much faster than through external techniques by providing wide data transfer paths between EEPROM 102 and SRAM 104. Thus, PLD 100 is configured very rapidly to provide essentially an "instant-on" capability (e.g., microseconds) due to the potentially rapid configuration process as compared to some conventional techniques (e.g., milliseconds).

As another example, configuration data stored in EEPROM 102 may be protected by security bits that configure circuitry to prevent unauthorized reading or copying of the configuration data (e.g., disable read back of the PLD pattern) from EEPROM 102 or SRAM 104. Furthermore, after programming EEPROM 102 (e.g., in a secure environment such as in the manufacturing facility), no further external bitstream is required that could potentially be copied during system operation in the field by examining the external pattern bitstream upon power-up.

Figure 2:
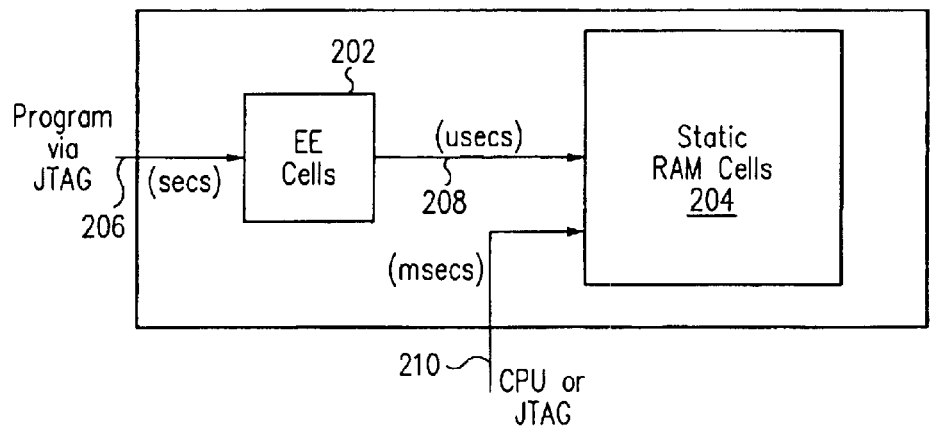
FIG. 2 shows a block diagram illustrating programming options of a programmable logic device in accordance with an embodiment of the present invention.

FIG. 2 shows a block diagram illustrating programming options of a programmable logic device in accordance with an embodiment of the present invention. FIG. 2 includes EE memory cells 202 and static RAM cells 204. For example, FIG. 2 may represent PLD 100 with EE memory cells 202 and static RAM cells 204 corresponding to EEPROM 102 and SRAM 104, respectively.

As shown in FIG. 2, EE cells 202 may be programmed via a JTAG data path 206, with static RAM cells 204 programmed by EE cells 202 via data path 208. Alternatively, static RAM cells 204, which are used to configure the programmable logic device of FIG. 2, may be programmed via a data path 210 directly via a JTAG port and/or a data port (e.g., a CPU port). In general, programming EE cells 202 may take longer (e.g., seconds) than programming static RAM cells 204 (e.g., milliseconds). However, once EE cells 202 are programmed, they can be employed to program static RAM cells 204 much faster (e.g., microseconds) than would generally be possible via data path 210.

Figure 3:
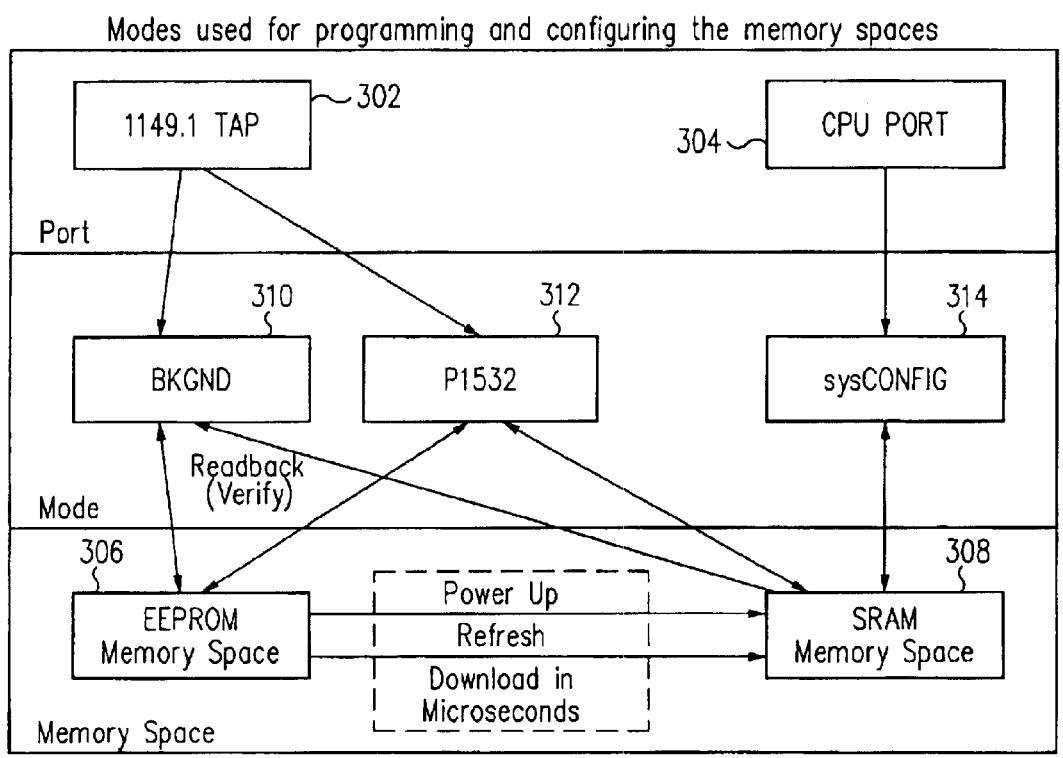
FIG. 3 shows a block diagram illustrating programming options of a programmable logic device in accordance with another embodiment of the present invention.

FIG. 3 shows a block diagram illustrating programming options of a programmable logic device in accordance with another embodiment of the present invention. For example, FIG. 3 may illustrate techniques for programming and/or configuring PLD 100 (FIG. 1). As shown in FIG. 3, two ports are provided, a data port 302 and a data port 304, which are used to provide external data (i.e., information, which may include control signals, configuration data, security bits, or other types of data) to memory within the PLD.

Because various approaches or manufacturing flows may differ, multiple techniques or methods are provided to program and configure the memory space of the PLD exemplified in FIG. 3. The memory space or memory of the PLD includes EEPROM 306 and SRAM 308, which can be configured or programmed as illustrated in FIG. 3.

For example, data port 302, which may for example represent an IEEE 1149.1 compliant test access port (TAP), may be used to program EEPROM 306 or SRAM 308 and, thus allow in-system programmability or programming through a device-programmer system. The programming algorithm and circuitry may be designed to be fully IEEE 1532 compliant to allow programming via an IEEE 1532 programming mode 312, which allows for universal support from general automated test equipment (ATE) and other types of test systems. EEPROM 306 may also be programmed in-system in a background mode (BKGND) 310 while the PLD continues to perform its system logic functions that are controlled or configured by SRAM 308. Control pins and/or instructions (e.g., control bits), for example, may be employed to determine which memory (EEPROM 306 or SRAM 308) will be used to store the externally-provided data (e.g., via data port 302) and which mode will be utilized (e.g., background mode 310 or 1532 programming mode 312).

SRAM 308 may also be programmed via data port 304. Data port 304 may, for example, represent a dedicated serial interface and/or a CPU port (e.g., a 33 MHz, 8-bit parallel port) utilized by an external microprocessor for transferring data to SRAM 308. When utilizing data port 304 to configure SRAM 308, the PLD is in a system configuration mode 314, with the data stored in SRAM 308 determining the logic and functionality provided by the PLD.

As illustrated in FIG. 3, there are three different ways to configure SRAM 308: 1) downloading data from EEPROM 306, 2) IEEE 1532 programming mode 312 via data port 302, and 3) system configuration mode 314 via data port 304. The fastest method for configuring SRAM 308 would generally occur by employing EEPROM 306 to download data to SRAM 308, which may occur, for example, in microseconds as compared to milliseconds or longer for the other methods. As an example, EEPROM 306 may download data directly to SRAM 308 automatically at power-up as well as on command by a user.

EEPROM 306 is bypassed when SRAM 308 is configured via data port 304 by employing system configuration mode 314 or configured via data port 302 by employing IEEE 1532 programming mode 312 (e.g., via IEEE 1149.1 TAP of data port 302). System configuration mode 314 may, for example, be available at power-up and upon user command to configure SRAM 308, with the PLD's input/output (I/O) circuits tri-stated during configuration of SRAM 308 (i.e., loading data into memory cells of SRAM 308).

In general, the PLD's I/O circuits may be tri-stated during configuration of SRAM 308. However in a conventional manner, when reading back the configuration data using system configuration mode 314, the I/O circuits and logic of the PLD may continue to operate to perform their intended functions. When configuring SRAM 308 using IEEE 1532 programming mode 312, the boundary-scan register controls the I/O circuits. Furthermore, after EEPROM 306 or SRAM 308 is programmed, a standard verify cycle may be performed, for example by background mode 310, to read back the data stored in the memory (i.e., EEPROM 306 or SRAM 308) to ensure that the PLD has been properly loaded with the configuration data (i.e., pattern). Table 1 summarizes various exemplary programming or configuration modes of operation in accordance with an embodiment illustrated in FIG. 3.

TABLE 1

Exemplary Modes of Operation

| OPERATION | DURING POWER-UP IN-SYSTEM | ON COMMAND IN-SYSTEM | OFFLINE (PROGRAMMER) |
|---|---|---|---|
| Auto-configure SRAM from on-chip EECMOS memory | Yes (e.g., in microseconds) | | |
| Reconfigure SRAM from on-chip EECMOS memory | | Yes (e.g., in microseconds) | |
| Program on-chip EECMOS memory while PLD is operating | | Yes (e.g., in seconds) | |
| Program on-chip EECMOS memory | | Yes (e.g., in seconds with JTAG port) | Yes (e.g., in seconds) |
| Configure SRAM directly in system configuration mode | Yes (e.g., in milliseconds) | Yes (e.g., in milliseconds) | |

Non-volatile and infinitely reconfigurable programmable logic devices are disclosed herein in accordance with one or more embodiments of the present invention. For example, programmable logic devices, such as for example high density FPGAs or CPLDs which utilize one or more aspects of the present invention, may be in-system programmable, dynamic reconfigurable, and/or have instant-on capability. For example, Lattice® Semiconductor Corp. manufactures ispXPGA™ and ispXPLD™ programmable logic devices that incorporate one or more aspects of the present invention. Details regarding implementation and configuration of these devices may be found, for example, in the preliminary data sheet entitled "ispXPLD 5000MX Family" dated October 2002, the preliminary data sheet entitled "ispXPGA Family" dated March 2003, and the technical note TN1026 entitled "ispXP Configuration Usage Guidelines" dated August 2002, all by Lattice® Semiconductor Corp. and which are all incorporated herein by reference in their entirety.

A non-volatile, infinitely reconfigurable PLD, in accordance with one or more embodiments of the present invention, may reliably provide designers with many desirable benefits, such as for example logic availability within microseconds of power-up or reprogramming and with high security. Significant savings may accrue in the amount of board space, system design effort, inventory costs, handling costs, and manufacturing costs that are required. Field system upgrades, including those performed during system operation, may be simplified.

In accordance with one or more embodiments, a flexible combination of programming/configuration modes permits a system designer to achieve numerous benefits. For example, programming may be performed in the manufacturing facility to allow the PLD to auto-configure during power-up (e.g., within microseconds). The PLD may be reconfigured periodically during operation. As an example, a field upgrade may be downloaded to reprogram EEPROM memory while the PLD is operating, with the data then used to reconfigure its SRAM in microseconds. Alternatively, a default pattern may be programmed into the EEPROM memory during manufacturing, but a new pattern may be programmed directly into the SRAM via one or more data ports (e.g., a JTAG or CPU port), depending on system conditions or a desired application. Furthermore, a pattern may be programmed into the EEPROM memory to verify system power-up and to checkout a configuration in manufacturing and then the PLD may be reconfigured to a system-operation pattern in-system via the data port.

Security of the PLD configuration pattern is enhanced because there is not a required external bitstream during configuration. Non-volatile security bits may also be employed to prevent or disable read back of the PLD pattern. Furthermore, system design may be simplified because there is no noise, reliability, or board space concerns related to configuration from an external source, such as for example a series programmable read only memory (SPROM).

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
    volatile memory adapted to configure the integrated circuit for its intended function based on configuration data stored by the volatile memory;
    non-volatile memory adapted to store data which is transferable to the volatile memory to configure the integrated circuit; and
    a first data port adapted to receive external data for transfer into either the volatile memory or the non-volatile memory.

2. The integrated circuit of claim 1, wherein the volatile memory comprises static random access memory and the non-volatile memory comprises electrically erasable programmable read only memory.

3. The integrated circuit of claim 1, wherein the non-volatile memory further is adapted to store security bits that can be set to prevent unauthorized reading of data from the integrated circuit.

4. The integrated circuit of claim 1, wherein the first data port supports an IEEE 1149.1 standard.

5. The integrated circuit of claim 4, wherein the integrated circuit further supports an IEEE 1532 standard via the first data port.

6. The integrated circuit of claim 1, wherein the integrated circuit further supports reading back of the configuration data stored in the volatile memory and/or the data stored in the non-volatile memory for verification.

7. The integrated circuit of claim 6, wherein the integrated circuit further supports the reading back while the integrated circuit performs its intended function based on the configuration data stored by the volatile memory.

8. The integrated circuit of claim 1, further comprising a second data port adapted to receive the external data for transfer into the volatile memory to configure the integrated circuit.

9. The integrated circuit of claim 8, wherein the second data port is a central processing unit port.

10. The integrated circuit of claim 1, wherein the integrated circuit supports transfer of the external data to the non-volatile memory while the integrated circuit is operable to perform its intended logic functions.

11. A programmable logic device comprising:

volatile memory adapted to store configuration data to configure the programmable logic device;

non-volatile memory adapted to store data and transfer the data to the volatile memory to configure the programmable logic device; and means for receiving external data and transferring the external data to the volatile memory or the non-volatile memory.

12. The programmable logic device of claim 11, wherein the means for receiving external data comprises a first data port and a second data port.

13. The programmable logic device of claim 12, wherein the first data port supports an IEEE 1149.1 standard.

14. The programmable logic device of claim 13, wherein the first data port supports an IEEE 1532 standard.

15. The programmable logic device of claim 11, wherein the programmable logic device supports transfer of the external data to the non-volatile memory while the programmable logic device is operable to perform its intended logic functions.

16. The programmable logic device of claim 11, wherein the programmable logic device further supports reading back of the configuration data stored in the volatile memory and/or the data stored in the non-volatile memory for verification.

17. The programmable logic device of claim 16, wherein the programmable logic device further supports the reading back while the programmable logic device performs its intended function based on the configuration data stored by the volatile memory.

18. A method of providing programming and configuration options for a programmable logic device, the method comprising:

providing at least one data port adapted to receive configuration data;

providing non-volatile memory, within the programmable logic device, adapted to receive the configuration data via at least one of the data ports; and providing volatile memory adapted to receive the configuration data via at least one of the data ports or via the non-volatile memory, the volatile memory further adapted to configure the programmable logic device for its intended function.

19. The method of claim 18, further comprising providing a read back mode which reads back the configuration data stored in the volatile memory and/or the non-volatile memory for data verification.

20. The method of claim 19, wherein the read back mode is performed while the programmable logic device is operable to perform its intended function.

21. The method of claim 18, wherein the non-volatile memory is further adapted to store security bits that indicate whether to prevent reading of the configuration data from the programmable logic device.

22. The method of claim 18, wherein the at least one data port comprises a first data port which provides a test access port and a second data port which provides a central processing unit port.

23. The method of claim 22, wherein the non-volatile memory is adapted to receive the configuration data via the first data port, and the volatile memory is adapted to receive the configuration data via the first data port and/or the second data port.

24. The method of claim 23, wherein the non-volatile memory is adapted to receive the configuration data via the first data port while the programmable logic device is operable to perform its intended function.

25. A programmable logic device comprising:

volatile memory adapted to configure the programmable logic device for its intended function based on configuration data stored by the volatile memory;

non-volatile memory adapted to store data which is transferable to the volatile memory to configure the programmable logic device, the non-volatile memory disposed within one or more areas of the programmable logic device that are separate from the volatile memory; and control logic adapted to transfer the data from the non-volatile memory to the volatile memory to configure the programmable logic device.

26. The programmable logic device of claim 25, further comprising a first data port adapted to receive external data that is selectively transferred into either the volatile memory or the non-volatile memory.

* * * * *